United States Patent
Orofino, II

(10) Patent No.: US 7,584,082 B2
(45) Date of Patent: Sep. 1, 2009

(54) SYNCHRONIZATION AND DATA REVIEW SYSTEM

(75) Inventor: Donald P. Orofino, II, Sudbury, MA (US)

(73) Assignee: The MathWorks, Inc., Natick, MA (US)

( * ) Notice: Subject to any disclaimer, the term of this patent is extended or adjusted under 35 U.S.C. 154(b) by 422 days.

(21) Appl. No.: 10/637,206

(22) Filed: Aug. 7, 2003

(65) Prior Publication Data

US 2005/0033561 A1   Feb. 10, 2005

(51) Int. Cl.
*G06F 9/455* (2006.01)

(52) U.S. Cl. ............... 703/6; 703/13; 714/20; 717/124

(58) Field of Classification Search ........ 703/6, 703/26, 13; 345/440, 855; 715/808; 705/7; 714/20, 33; 463/33; 128/204.21; 434/262; 717/124; 700/291
See application file for complete search history.

(56) References Cited

U.S. PATENT DOCUMENTS

| | | | | |
|---|---|---|---|---|
| 4,914,568 | A * | 4/1990 | Kodosky et al. | 715/763 |
| 5,684,945 | A * | 11/1997 | Chen et al. | 714/20 |
| 6,088,029 | A * | 7/2000 | Guiberson et al. | 715/808 |
| 6,618,648 | B1 * | 9/2003 | Shirota et al. | 700/291 |
| 7,130,807 | B1 * | 10/2006 | Mikurak | 705/7 |
| 2002/0168618 | A1 * | 11/2002 | Anderson et al. | 434/262 |
| 2003/0037786 | A1 * | 2/2003 | Biondi et al. | 128/204.21 |
| 2003/0122826 | A1 * | 7/2003 | Eryilmaz et al. | 345/440 |
| 2003/0192032 | A1 * | 10/2003 | Andrade et al. | 717/124 |
| 2004/0061726 | A1 * | 4/2004 | Dunn et al. | 345/855 |
| 2004/0093197 | A1 * | 5/2004 | Billemaz et al. | 703/13 |
| 2004/0128120 | A1 * | 7/2004 | Coburn et al. | 703/26 |
| 2004/0153804 | A1 * | 8/2004 | Blevins et al. | 714/33 |
| 2004/0266526 | A1 * | 12/2004 | Herbrich et al. | 463/33 |

OTHER PUBLICATIONS

Bishop, "Modern Control Systems Analysis and Design Using Matlab and Simulink", Addison-Wesley Logman, Inc., pp. 1, 7-16, 95-102, 1997.*

Mathworks, "Using Simulink", Version 2.2, Jan. 1998, pp. 4-1-4-20, 7-2, 7-8-7-14, 9-118-9-125, 9-146-9-152.*

Vujosevic, Ranko ("Object Oriented Visual Interactive Simulation", Proceedings of the 1990 Winter Simulation Conference, pp. 490-498.*

(Continued)

*Primary Examiner*—Paul L Rodriguez
*Assistant Examiner*—Kandasamy Thangavelu
(74) *Attorney, Agent, or Firm*—Lahive & Cockfield, LLP; Kevin J. Canning

(57) ABSTRACT

A method and system to control data collection and display parameters in two or more data modules in a dynamic system. The method and system provide the ability to collect and display data in a dynamic system having two or more data modules communicatively coupled thereto. As the dynamic system operates, data is generated. At least one controller manages data collection and display behavior of the two or more data modules. Ultimately, the controller controls data collection and display parameters for each of the two or more data modules in a manner that enables synchronization. The controller can be imbedded within the control module system. The method and system provides the user with the ability to better control, manipulate, review, and synchronize the collection of data in a dynamic system, whether physical or virtual, real time, or a simulation.

87 Claims, 9 Drawing Sheets

OTHER PUBLICATIONS

McLean et al., "Applying temporal data bases to HLA data collection and analysis", 1998 Winter simulation conference.*
Radhakrishnan et al., "External adjustment of runtime parameters in time warp synchronized parallel simulators", IEEE 1997.*
Ostroff, J., "Composition and refinement of discrete real time systems", ACM 1999.*
Dey et al., "Performance analysis of a system of communicating processes", IEEE, 1997.*

* cited by examiner

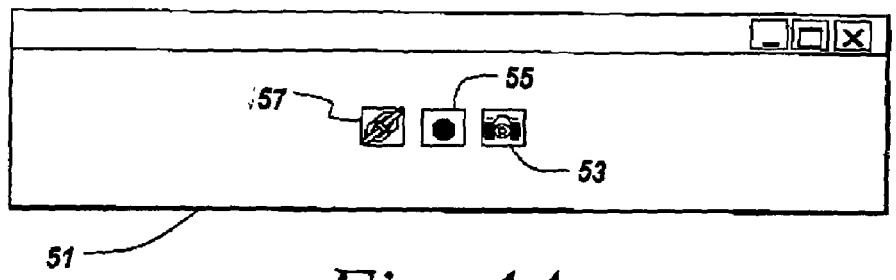
*Fig. 4A*
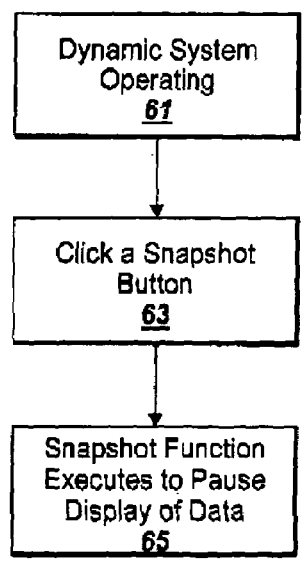 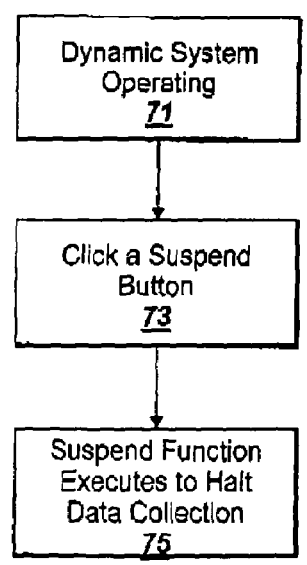
*Fig. 4B*   *Fig. 4C*

SYNCHRONIZATION AND DATA REVIEW SYSTEM

FIELD OF THE INVENTION

The present invention relates to a data collection system suitable for controlling the collection of data from a plurality of instruments, and more particularly to a data collection system providing synchronization capability for the collection of data from multiple sources and subsequent data review.

BACKGROUND OF THE INVENTION

A dynamic system (either natural or man-made) is a system whose response at any given time is a function of its input stimuli, its current state, and the current time. Such systems range from simple to highly complex systems. Physical dynamic systems include a falling body, the rotation of the earth, bio-mechanical systems (muscles, joints, etc.), bio-chemical systems (gene expression, protein pathways), weather and climate pattern systems, etc. Examples of man-made or engineered dynamic systems include: a bouncing ball, a spring with a mass tied on an end, automobiles, airplanes, control systems in major appliances, communication networks, audio signal processing, nuclear reactors, a stock market, and the like. It should further be noted that there can be different types of dynamic systems, including but not limited to textual, graphical, block diagram, data flow, time driven, event driven, and the like.

Dynamic systems often include a plurality of different forms of instrumentation, some of which provide the ability to monitor and/or measure different aspects of the dynamic system. The instrumentation that monitors and/or measures different aspects of the dynamic system receives a stream of data that corresponds to the aspect being monitored or measured.

In addition, professionals from diverse areas such as engineering, science, education, and economics build mathematical models of dynamic systems in order to better understand system behavior as it changes with the progression of time. The mathematical models aid in building "better" systems, where "better" may be defined in terms of a variety of performance measures such as quality, time-to-market, cost, speed, size, power consumption, robustness, etc. The mathematical models also aid in analyzing, debugging and repairing existing systems (be it the human body or the anti-lock braking system in a car). The models may also serve an educational purpose of educating others on the basic principles governing physical systems. The models and results are often used as a scientific communication medium between humans.

Powerful numeric computing methods and graphics let a user test ideas and explore alternatives through simulation. One such software application for technical computing is MATLAB®, which is provided by The Mathworks, Inc. of Natick, Mass.

Furthermore, engineers and scientists have utilized time-based block diagram models in numerous scientific areas such as Feedback Control Theory and Signal Processing to study, design, debug, and refine dynamic systems. Dynamic systems, which are characterized by the fact that their behaviors change over time, are representative of many real-world systems. Time-based block diagram modeling has become particularly attractive over the last few years with the advent of software packages such as Simulink® from The MathWorks, Inc. of Natick, Mass.

Block diagrams are a set of graphical connections between blocks to model the above-described dynamic systems. The individual blocks in a block diagram represent mathematical operations and output a result.

Both the numerical or text simulation packages and the block diagram simulation packages provide sophisticated software platforms with a rich suite of support tools that makes the analysis and design of dynamic systems efficient, methodical, and cost-effective.

A block diagram simulation environment, such as Simulink®, often consists of multiple display devices connected simultaneously to multiple signals, to monitor the progress of a simulation at various points of interest. Conventional block diagram environments often offer scope-type instrumentation blocks to be used in these situations, with each scope connected to a point of interest in the simulation. One of ordinary skill in the art will appreciate that the physical dynamic systems can likewise include instruments such as scopes to retrieve and display data from the dynamic system operation.

To coordinate an effective analysis of a complicated simulation, it is sometimes desirable to "pause" scopes to explore captured data, while the simulation continues to execute in the background. It is also sometimes desirable to completely "suspend" data collection by the scopes. It is further desirable to be able to synchronize the analysis of simultaneous signals by pausing or suspending data collection across multiple scopes at the same instant in time, to assess relationships between the data and signals at various points within the model.

In addition, there is often a need to set the parameters for data collection, manipulation, and review. There is also a need to provide a data collection, review, display, and/or manipulation system separate from the dynamic system that obtains data from the dynamic system

SUMMARY OF THE INVENTION

In accordance with one embodiment of the present invention, in a simulation environment, a method for controlling collection of data generated by a dynamic system model includes providing the dynamic system model. A control system is provided having two or more data modules, the two or more data modules being communicatively coupled to receive data from the dynamic system model. The dynamic system model is activated, thereby generating data. Data collection by the two or more data collection modules is synchronized using the control system.

In accordance with aspects of the present invention, a snapshot function can be executed to direct at least one of the two or more data modules to freeze a display of data collected while the dynamic system model continues to execute and the data continues to be collected. A user can review the display of data collected while data continues to be collected without updating the display. A user can manipulate the display of data collected while data continues to be collected.

In accordance with further aspects of the present invention, a suspend function can be executed to pause collection of data while the dynamic system continues to operate. An interface can be provided having a communication port for communicating with each of the two or more data modules. A review of data collected can be implemented by the two or more data collection instruments by utilizing a review function. A user can define data history parameters utilizing a data history function. The data history parameters can include at least one of amount of data history, amount of memory allocation for storing data history, types of data collected, signal attributes, and data formats.

In accordance with further aspects of the present invention, a buffering mode can be directed to be utilized during data collection from one of a circular buffering mode, a finite buffering mode, and a buffer extension mode by executing a data buffering mode function. A user can utilize a scroll function to scroll through previously collected data while the dynamic system model is operating. A time tracking function can be provided that directs a graphical display indication of a time history of data collected.

In accordance with further aspects of the present invention, synchronizing the two or more data modules can include conveying to selected of the two or more data modules a direction to synchronize execution of one or more functions at the selected of the two or more data modules by utilizing a broadcasting function.

In accordance with further aspects of the present invention, an event based trigger can be utilized to initiate a data module action. The simulation environment can include at least one of a graphical, textual, data flow, time based, and event based environments. The two or more data modules can be virtually formed using at least one of MATLAB, JAVA, C++, object-oriented code, and computer code. The two or more data modules can provide displays in the form of at least one of textual, graphical, multi-dimensional, oscilloscope, and spectrum analyzer. The control system can be a separate system from the dynamic system.

In accordance with another embodiment of the present invention, in a simulation environment, a method for controlling collection of data generated by a model of a dynamic system can include providing the model of the dynamic system. A control system can be provided having two or more data modules, the two or more data modules being communicatively coupled to receive data from the model of the dynamic system. The model of the dynamic system is activated, thereby generating data. Data collection by the two or more data collection modules is synchronized using the control system. A snapshot function is executed to direct at least one of the two or more data modules to freeze a display of data collected while the model dynamic system continues to execute and the data continues to be collected.

In accordance with another embodiment of the present invention, in a simulation environment, a method for controlling collection of data generated by a model of a dynamic system includes providing the model of the dynamic system. A control system is provided having two or more data modules, the two or more data modules being communicatively coupled to receive data from the model of the dynamic system. The model of the dynamic system is activated, thereby generating data. Data collection by the two or more data collection modules is synchronized using the control system. A suspend function is executed to pause collection of data while the dynamic system continues to operate.

In accordance with another embodiment of the present invention, A method for controlling collection of data generated by a dynamic system includes providing the dynamic system. A control system is provided having two or more data modules, the two or more data modules being communicatively coupled to receive data from the dynamic system. The dynamic system is activated, thereby generating data. Data collection by the two or more data collection modules is synchronized using the control system.

In accordance with further aspects of the present invention, the dynamic system is at least one of a virtual system and a physical system. The control system is a separate system from the dynamic system.

In accordance with another embodiment of the present invention, in a simulation environment, a system for controlling collection of data generated by a dynamic system model includes the dynamic system model being provided in a simulation application and configured to generate the data. A control system has two or more data modules, the two or more data modules being communicatively coupled to receive data from the dynamic system model. The data collection by the two or more data collection modules is synchronized using the control system.

In accordance with another embodiment of the present invention, in a simulation environment, a system for controlling collection of data generated by a model of a dynamic system includes the dynamic system model being provided in a simulation application and configured to generate the data. A control system has two or more data modules, the two or more data modules being communicatively coupled to receive data from the dynamic system model. The data collection by the two or more data collection modules is synchronized using the control system. A snapshot function is provided that directs at least one of the two or more data modules to freeze a display of data collected while the model dynamic system continues to execute and the data continues to be collected.

In accordance with another embodiment of the present invention, in a simulation environment, a system for controlling collection of data generated by a model of a dynamic system includes the dynamic system model being provided in a simulation application and configured to generate the data. A control system has two or more data modules, the two or more data modules being communicatively coupled to receive data from the dynamic system model. The data collection by the two or more data collection modules is synchronized using the control system. A suspend function is provided to pause collection of data while the dynamic system continues to operate.

In accordance with another embodiment of the present invention, a system for controlling collection of data generated by a dynamic system includes the dynamic system being provided in a simulation application and configured to generate the data. A control system has two or more data modules, the two or more data modules being communicatively coupled to receive data from the dynamic system. The data collection by the two or more data collection modules is synchronized using the control system.

In accordance with one embodiment of the present invention, a method for controlling at least one parameter relating to data outputted by a dynamic system includes providing the dynamic system having two or more data modules communicatively coupled thereto and suitable for use in collection and analysis of data output, operating the dynamic system thereby resulting in a generation of data output, and managing at least one of data collection and data display behavior by the two or more data modules of the data output.

In accordance with aspects of the present invention, the dynamic system can include a physical system of data modules and/or a virtual system of data modules. The dynamic system operates in a simulation environment. The method can further include providing an interface having a communication port for communicating with each of the two or more data modules.

In accordance with further aspects of the present invention, at least one of data collection and display behavior are managed by instructing at least one of the two or more data modules to begin data collection and to halt data collection; instructing at least one of the two or more data modules to pause data collection while the dynamic system continues to operate, by utilizing a pause function; and/or executing a snapshot function, directing at least one of the two or more data modules to freeze a display of data collected while the dynamic system continues to operate and the data continues to be collected. A user can review the display of data collected while data continues to be collected without updating the display of data, and/or manipulate the display of data collected while data continues to be collected.

In accordance with further aspects of the present invention, managing at least one of data collection and display behavior is carried out by directing at least one of the two or more data modules to freeze a collection and display of data by utilizing a suspend function; directing a review of data collected by the two or more data modules by utilizing a review function; and/or a user defining data history parameters utilizing a data history function. The data history parameters can include at least one of amount of data history, amount of memory allocation for storing data history, types of data collected, signal attributes, and data formats. Managing at least one of data collection and display behavior can also be carried out by directing a buffering mode to be utilized during data collection from one of a circular buffering mode, a finite buffering mode, and a buffer extension mode by executing a data buffering mode function.

In accordance with further aspects of the present invention, a user can utilize a scroll function to scroll through previously collected data while the dynamic system is operating. A time tracking function can be provided that directs a graphical display indication of a time history of data collected. Managing at least one of data collection and display behavior can occur by conveying to selected of the two or more data modules a direction to synchronize execution of one or more functions at the selected of the two or more data modules by utilizing a synchronizing function, and/or by utilizing an event based trigger to initiate a controller action.

In accordance with one embodiment a system for controlling at least one parameter relating to data outputted by a dynamic system includes two or more data modules each provided with an interface. Two or more controllers, each provided with one of the two or more data modules, are further provided. The two or more controllers being for managing data collection and display behavior of each of the two or more data modules and being communicatively coupled with the interface. The two or more controllers control data collection and display parameters by each of the two or more data modules.

In accordance with aspects of the present invention, the system includes a physical system of data modules, and/or a virtual system of data modules. The system can operate in a simulation environment. The interface can include a single interface having a communication port for communicating with each of the two or more data modules. The two or more controllers can instruct at least one of the two or more data modules to begin data collection and to halt data collection.

In accordance with further aspects of the present invention, a pause function cause the two or more controllers to instruct at least one of the two or more data modules to pause data collection while the dynamic system continues to operate. The two or more controllers can include a snapshot function that directs at least one of the two or more data modules to freeze a display of data collected while the dynamic system continues to operate and the data continues to be collected. A user can review the display of data collected while data continues to be collected without updating the display of data. A user can manipulate the display of data collected while data continues to be collected.

In accordance with further aspects of the present invention, the two or more controllers can further include a suspend function that directs at least one of the two or more data modules to freeze a collection and display of data; a review function that directs a review of data collected by the two or more data modules; and/or a data history function that enables the user to define data history parameters. The data history parameters can include at least one of amount of data history, amount of memory allocation for storing data history, types of data collected, signal attributes, and data formats.

In accordance with further aspects of the present invention, the two or more controllers can further include a data buffering mode function that directs a buffering mode to be utilized during data collection from one of a circular buffering mode, a finite buffering mode, and a buffer extension mode; a scroll function that enables the user to scroll through previously collected data while the dynamic system is operating; a time tracking function that directs a graphical display indication of a time history of data collected; and/or a synchronizing function that conveys to selected of the two or more data modules a direction to synchronize execution of one or more functions at the selected of the two or more data modules. Actions of the two or more controllers can be triggered by occurrence of selected events.

In accordance with one embodiment of the present invention, a medium holding computer executable steps for executing a method for controlling at least one parameter relating to data outputted by a dynamic system is provided. The method includes providing the dynamic system having two or more data modules communicatively coupled thereto and suitable for use in collection and analysis of data output, operating the dynamic system thereby resulting in a generation of data output, and managing at least one of data collection and data display behavior by the two or more data modules of the data output.

In accordance with one embodiment of the present invention, a system for controlling at least one parameter relating to data outputted by a dynamic system includes an interface for communicating with two or more data modules. A controller for managing data collection and display behavior of each of the two or more data modules, is also provided. The controller is communicatively coupled with the interface. The controller controls data collection and display parameters for each of the two or more data modules.

In accordance with one embodiment of the present invention, a method for controlling at least one parameter relating to data outputted by a dynamic system includes providing the dynamic system having two or more data modules communicatively coupled thereto and suitable for use in collection and analysis of data output. The dynamic system is operated, thereby resulting in a generation of data output. At least one of data collection and data display behavior are managed by the two or more data modules of the data output. Data collection and display parameters are controlled for each of the two or more data modules, and a synchronizing function provides at least two of the two or more data modules with a direction to synchronize execution of one or more functions.

In accordance with one embodiment of the present invention, a system for controlling collection and display of data generated by a dynamic system includes an interface for communicating with two or more data modules. A controller for managing data collection and display behavior of each of the two or more data modules is provided. The controller is communicatively coupled with the interface. The controller controls data collection and display parameters for each of the two or more data modules, and the controller further utilizes a synchronizing function to provide at least two of the two or more data modules with a direction to synchronize execution of one or more functions.

In accordance with one embodiment of the present invention, a medium holding computer executable steps for executing a method for controlling collection and display of data generated by a dynamic system is provide the method includes providing the dynamic system having two or more data modules communicatively coupled thereto. The dynamic system is operated, thereby resulting in a generation of data. A controller is utilized to manage data collection and display behavior of the two or more data modules. The controller controls data collection and display parameters for each of the two or more data modules, and the controller further utilizes a synchronizing function to provide at least two of the two or more data modules with a direction to synchronize execution of one or more functions.

BRIEF DESCRIPTION OF THE DRAWINGS

The present invention will become better understood with reference to the following description and accompanying drawings, wherein:

FIG. 4A is a screen depiction of a tool bar having several function buttons, according to one aspect of the present invention;

FIGS. 4B and 4C are flowcharts showing operation of snapshot and suspend functions, according to one aspect of the present invention;

DETAILED DESCRIPTION

Figure 1:
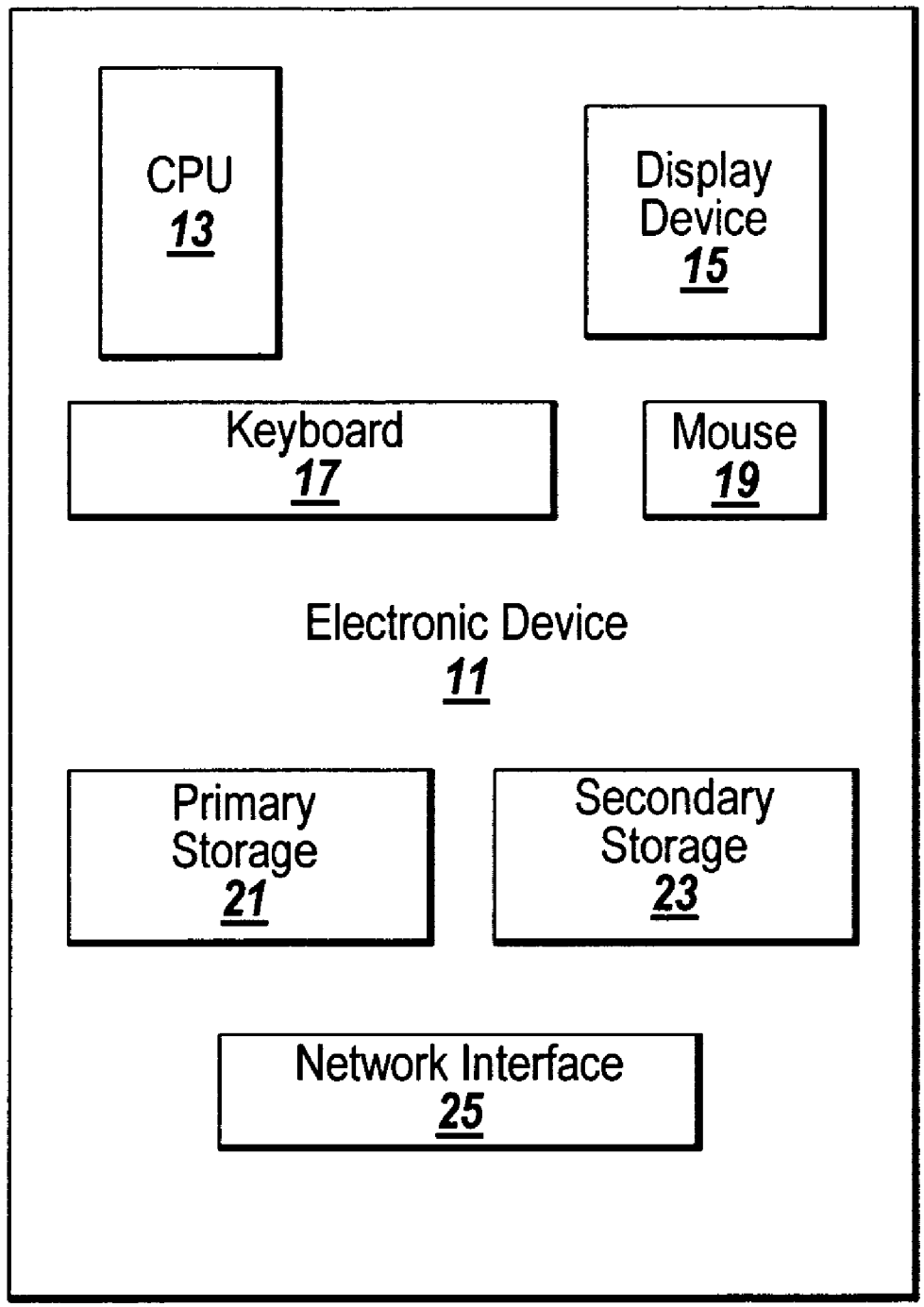
FIG. 1 is a diagrammatic illustration of an electronic device, according to one aspect of the present invention.

An illustrative embodiment of the present invention relates to at least one controller provided to control data collection and display parameters for two or more data modules that can collect and/or display in a dynamic system. The method and system provide the ability to collect and display data in a dynamic system having two or more data modules that are communicatively coupled thereto, while the system is operating and generating data. At least one controller manages data collection and display behavior of the two or more data modules. Ultimately, the controller controls data collection and display parameters for each of the two or more data modules in a manner that enables synchronization.

More specifically, the present invention provides the user with the ability to better control, manipulate, view, review, and synchronize the collection of data in a dynamic system. Two or more data modules receive data outputs from the dynamic system and then forward, manipulate, review, and/or display the data. A central controller or a distributed plurality of controllers are provided to configure the data collection and display parameters as well as synchronize data collection as desired. It should be noted that the central or distributed controllers, and the data modules, are separate systems from the dynamic system being monitored or measured. The result is a coordinated data collection process that more effectively collects and controls data outputs generated by the dynamic system. The synchronized data modules can execute a plurality of different functions and operations, including suspending data collection and taking a momentary snapshot of collected data while data collection continues. Examples of data modules may include virtual components or functions, physical instruments or devices, and parts of a model that collect and/or display data (such as a display of an input or output value). The virtual data modules can be formed using a variety or resources known to those of ordinary skill in the art, such as C++, JAVA, MATLAB, object-oriented code, or other code. With regard to physical displays, such displays can likewise vary from textual to graphical, 2-dimensional, 3-dimensional, oscilloscope, and the like.

For purposes of the discussion below, an example configuration having two or more data modules is provided. However, the present invention is not limited to the illustrative configurations described, but instead can be utilized in a number of different data collection and display arrangements.

FIGS. 1 through 9E, wherein like parts are designated by like reference numerals throughout, illustrate example embodiments of a synchronization and data collection, manipulation, and review system according to the present invention. Although the present invention will be described with reference to the example embodiments illustrated in the figures, it should be understood that many alternative forms can embody the present invention. One of ordinary skill in the art will additionally appreciate different ways to alter the parameters of the embodiments disclosed, such as the size, shape, or type of elements or materials, in a manner still in keeping with the spirit and data module of the present invention.

There are many particular varieties of graphical data module displays, each suited to a range of analysis needs, but a general categorization yields two basic modes of data module operation: triggered and free-running. The present description focuses on the free-running mode of data module operation, such as strip-chart recorders and waveform viewers, or virtual representations of similar instruments, in which all data output is to be recorded within specified intervals of time. Synchronization of a pausing of multiple strip-chart type instruments is an exemplary use of the contributions of the present invention, in addition to subsequent coordinated data review. In contrast, triggered data modules generally capture only one display full of data, pausing the data capture after the specific triggering event, and then enabling data capture once another trigger event occurs. It is natural to pause a triggered data module after the acquisition of a display full of data; multiple triggered data modules simply follow the triggering mechanism and do not generally require additional synchronization mechanisms. However, one of ordinary skill in the art will appreciate that the present invention can be utilized to control and synchronize collection of data outputs by such triggered data modules; thus, the present invention does not discount such usage. Moreover, the data modules can be scopes, data collection and/or display components, display inputs or outputs, or even intermediate data values, for example.

FIG. 1 illustrates one example embodiment of an electronic device 11 suitable for practicing illustrative embodiments of the present invention. The electronic device 11 is representative of a number of different technologies, such as personal computers (PCs), laptop computers, workstations, personal digital assistants (PDAs), Internet appliances, cellular telephones, pagers, and the like. In the illustrated embodiment, the electronic device 11 includes a central processing unit (CPU) 13 and a display device 15. The display device 15 enables the electronic device 11 to communicate directly with a user through a visual display. The electronic device 11 further includes a keyboard 17 and a mouse 19. Other potential input devices not depicted include a stylus, trackball, joystick, touch pad, touch screen, and the like. The electronic device 11 includes primary storage 21 and secondary storage 23 for storing data and instructions. The storage devices 21 and 23 can include such technologies as a floppy drive, hard drive, tape drive, optical drive, read only memory (ROM), random access memory (RAM), and the like. Applications such as browsers, JAVA virtual machines, and other utilities and applications can be resident on one or both of the storage devices 21 and 23. The electronic device 11 also includes a network interface 25 or communication port for communicating with one or more electronic devices external to the electronic device 11 depicted. A modem (not shown) is one form of establishing a connection with an external electronic device or network. The CPU 13 has either internally, or externally, attached thereto one or more of the aforementioned components. The present invention can make use of many different types of electronic devices. Furthermore, the present invention can make use of software applications installed on such electronic devices, such as Matlab® and/or Simulink® modeling applications, or other simulation or modeling applications.

Figure 2:
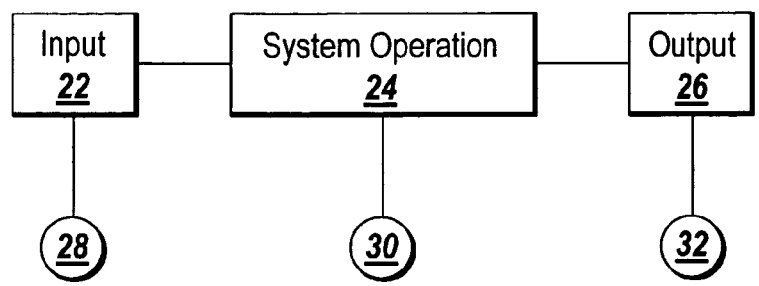
FIG. 2 is a diagrammatic illustration of a dynamic system, according to one aspect of the present invention.

FIG. 2 is a diagrammatic illustration of a dynamic system 20. The dynamic system 20 can generally be described as a system whose response at any given time is a function of its input stimuli, its current state, and the current time. The system illustrated represents both a physical or real time system and a virtual or simulation system. In fact, as referred to herein, the term "dynamic system" is intended to encompass both the physical or real time embodiments and the virtual or simulation embodiments of a system being measured. To further clarify, the present invention is applicable to both the physical and virtual environments, as previously mentioned, and is not limited to one or the other.

The dynamic system 20 can be described most simply and generally as having an input 22 coupled with some form of system operation 24 which results in an output 26. The input 22 can take many different forms and can represent more than one variable or value inputted to the system operation 24. The system operation 24 represents either a simple system, such as for example a spring that compresses in a linear direction when a force is applied; or a more complex system, such as for example an autopilot device that receives multiple inputs relating to speed, position, flight path, environmental conditions, forces being applied to the airplane, and the like. The output 26 represents those actions or occurrences that result from the system operation 24 receiving the input 22 and executing a course of action or implementation.

In many instances, the dynamic system 20 will have a plurality of data modules connected therewith. The term "data module" as utilized herein refers a component or function that offers viewing, observing, displaying, gathering, and/or recording capabilities for different forms of data. The data module 28, 30 or 32 generally serves as a collection and/or display vehicle for monitoring or measuring the operation of the dynamic system 20, or of a selected portion of the dynamic system 20. As illustrated, the dynamic system has a first data module 28 coupled with the input 22, a second data module 30 coupled with the system operation 24, and a third data module 32 coupled with the output 26. It should be noted that there can be any number of different data modules in communication with the dynamic system 20, including multiple data modules coupled with each component or portion of the dynamic system 20, as understood by one of ordinary skill in the art. Furthermore, the data modules are located in separate systems from the dynamic system 20.

Figure 3:
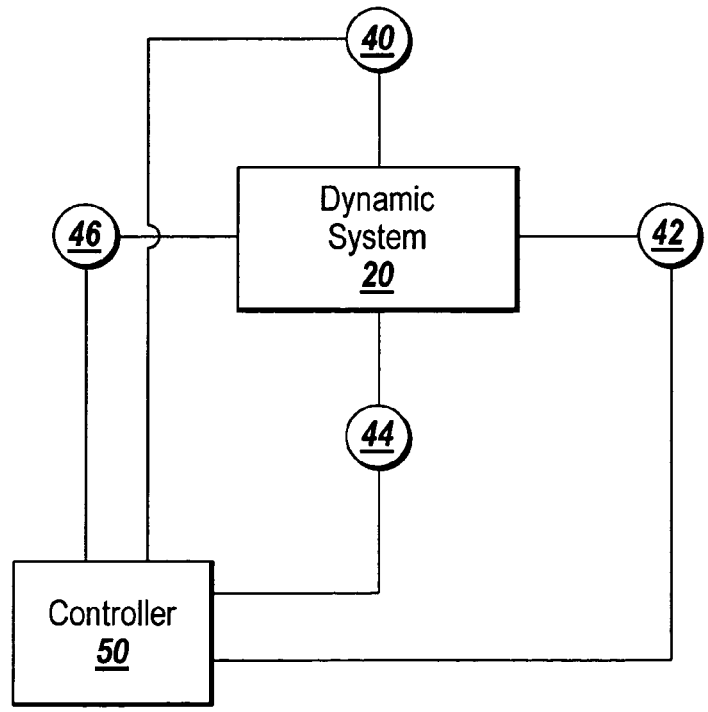
FIG. 3 is a diagrammatic illustration of the dynamic system coupled with a controller, according to one aspect of the present invention.

FIG. 3 shows a diagrammatic illustration of the dynamic system 20. As illustrated, the dynamic system 20 includes a first data module 40, a second data module 42, a third data module 44, and a fourth data module 46 collecting data from the operation of the dynamic system 20. Each of the data modules 40, 42, 44, and 46 can be coupled with a same component or a different component within the dynamic system 20, as desired. The data modules 40, 42, 44, and 46 are configured to collect data as the dynamic system 20 operates. As previously stated, the dynamic system 20 represents both the physical instance and the virtual instance of a dynamic system. However, the following discussion makes use of the virtual or simulation instance to clarify aspects of the present invention. It should be noted that the virtual instance is being used for illustrative purposes, and is not intended to be limiting to the breadth and scope of the present invention.

To implement the various aspects of the present invention, a controller 50 exists communicatively coupled with the dynamic system 20 and/or individual data modules of the dynamic system 20, such as the data modules 40, 42, 44, and 46 shown in FIG. 3. The controller 50 can take many different forms, including an electronic device, a hardware device, or a software device, or an executable function supplied by a software application, as understood by one of ordinary skill in the art. The controller 50 is separate from the dynamic system, such as a separate device or underlying application. The controller 50 provides added functionality for the control of data collection from multiple data modules, as further described herein.

Referring to FIGS. 4A, 4B, and 4C, the controller 50 can provide a snapshot function, in which the data modules cease updating a data module display in response to user input, such as clicking a button in a graphical interface (GUI) 51, such as in FIG. 4A. The data modules cease updating a data module display while the simulation continues to perform computations advancing in time. Providing that the dynamic system 20 is operating (step 61), the user clicks (step 63) on a snapshot button 53 and the snapshot function executes for selected data modules (step 65). When the snapshot function executes, the data displayed at the data modules freezes, although data continues to be collected by the data modules, and once the display is unfrozen (by clicking on the snapshot button 53 again), the display of data updates again.

The activation of the snapshot function can also be event based, if desired, wherein the occurrence of an event such as elapsed time or other action triggers the activation. The event can be defined using the GUI 51 and the snapshot button 53, which can lead the user to an input screen for defining events to trigger use of the snapshot function, as understood by one of ordinary skill in the art. While paused, the data history captured by the data modules can be reviewed, measured, or exported, to other applications for additional verification. In other words, the snapshot function freezes the display of data being collected, while the data module continues to operate to collect data. Thus, once a user has completed the review, measurement, export, or the like, the data module can return to displaying ongoing data collection without a gap in data collection for the time that the snapshot function was operating.

The controller 50 can include a suspend function used to momentarily cease data capture by the data modules. Similar to the snapshot function, the data modules cease updating a data module display in response to user input, such as clicking a button in a graphical interface. Provided that the dynamic system 20 is operating (step 71), to activate the suspend function, the user can click (step 73) on a suspend button 55 in the GUI 51. The suspend function then executes (step 75) at selected data modules. Upon activation of the suspend function, the data module ceases to collect data until otherwise instructed. Thus, a gap in data collection can form between two instances of the data module collecting data with a period of suspension therebetween.

The activation of the suspend function can also be event based, if desired, wherein the occurrence of an event such as elapsed time or other action triggers the activation. Again, the definition of the event trigger can be provided by the user by clicking on the suspend button 55 and providing additional parameters. While paused, the data history captured by the data modules can be reviewed, measured, or exported, to other applications for additional verification. However, while paused, the data module does not continue to collect data. In other words, the suspend function freezes the display of data being collected, as well as freezing the collection of data itself. Thus, once a user has completed the review, measurement, export, or the suspend function is otherwise halted, the data module can return to displaying ongoing data collection and collecting data. A gap in data collection for the time that the suspend function was operating will, however, exist.

Other additional functions can be implemented by the controller 50 in a similar manner to the suspend and snapshot functions. For example, another function that can be implemented by the controller 50 is a data history function that various aspects of storing data. A first aspect is the control of a length of data history or, data capture, maintained by either the data modules or the controller 50. The amount of data history recorded by each data module can be user defined and is often variable, as is the amount of data history presented at any one time in the data module display. For example, a parameter can be set with the controller 50 indicating that only a selected number of data entries should be maintained at any one time. Alternatively, the amount of data saved in the data history can be linked to defining an age of the data, such that after a selected elapsed time since the data was first recorded, the data is deleted. Further, the amount of data saved in the data history can be linked to a selected size of memory to be allocated to the task of storing the data. Once the limit is reached, old data is deleted as new data is introduced, on a first-in-first-out basis. Other methods for tracking and controlling the amount of data stored in the data history will be apparent to those of ordinary skill in the art, and can be implemented utilizing the controller 50 of the present invention.

Another aspect of the data history function includes accommodating data modules with different data types. Different data representations (e.g., floating point, fixed point), signal attributes (e.g., real vs. complex signals), formats (e.g., scalars, vectors, matrices), and other characteristics may be individually preserved and displayed on each data module, and their formats controlled by the controller 50.

Figure 5A:
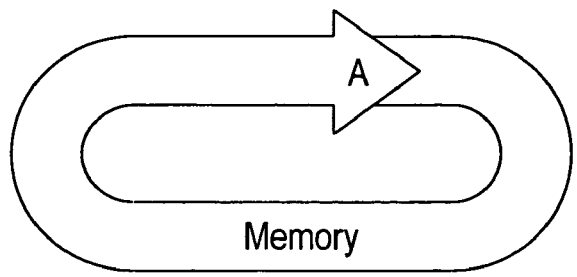
FIGS. 5A, 5B, and 5C are diagrammatic illustrations of buffering methods, according to aspects of the present invention.
Figure 5B:
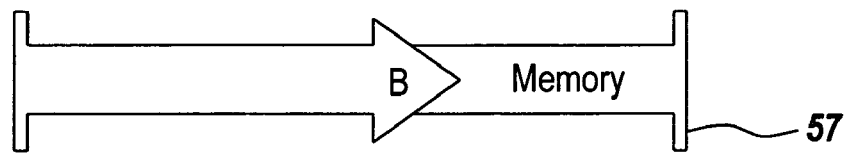
Figure 5C:
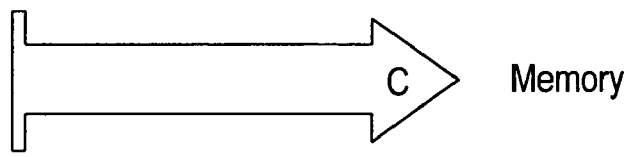

In accordance with further aspects of the present invention, the controller provides a data buffering function. The data module may or may not stop accumulating data when a function such as the snapshot function is operating, depending on the data-buffering mode selected. There are a number of different buffer modes that can be implemented, some of which are illustrated in FIGS. 5A, 5B, and 5C. FIG. 5A shows a first buffer mode, circular buffering, which requires data collection to be halted during the snapshot. If the data collection is not halted, data corruption in the circular buffer will occur given an arbitrarily long length of pause. This is because with a circular buffer, once the memory allocated to the buffer is full of data, the buffer begins to write over the old data. In looking at the figure, arrow A indicates the location of the data writing to memory. As the arrow A moves along, representing the data being written to the buffer, the memory becomes filled. Once the arrow A returns around to the point from which it began, if the arrow A continues to write, it will write over existing data. Thus, if the length of the pause is too long, data that has not been viewed or manipulated could be written over and permanently lost.

Another buffer mode, finite buffering, is shown in FIG. 5B. Finite buffering supports data collection during the pause interval up to the length of the data buffer that is available. Once the buffer is full, data collection is instructed to cease. As shown in the figure, arrow B represents data being written to the buffer memory. There is a finite amount of memory, as indicated by an end 57 of the memory allocation. Thus, one must be careful if a finite buffering mode is chosen that there will not be too much data collected prior to the desired review or manipulation taking place.

Still another buffer mode, buffer extension, is shown in FIG. 5C. The buffer extension buffer mode permits unconstrained data collection during the pause interval, no matter how long the pause lasts. Arrow C indicates the location of the data being written to memory. As arrow C progresses, additional memory is allocated to store the data. Such a buffer mode requires an effectively unlimited amount of memory be made available to the buffer. As the data collected grows, the memory attributed to the buffer can grow. Eventually, a limit is reached when the memory is exhausted. However, a buffer extension mode is useful for accommodating arbitrarily large data sets.

Figure 6A:
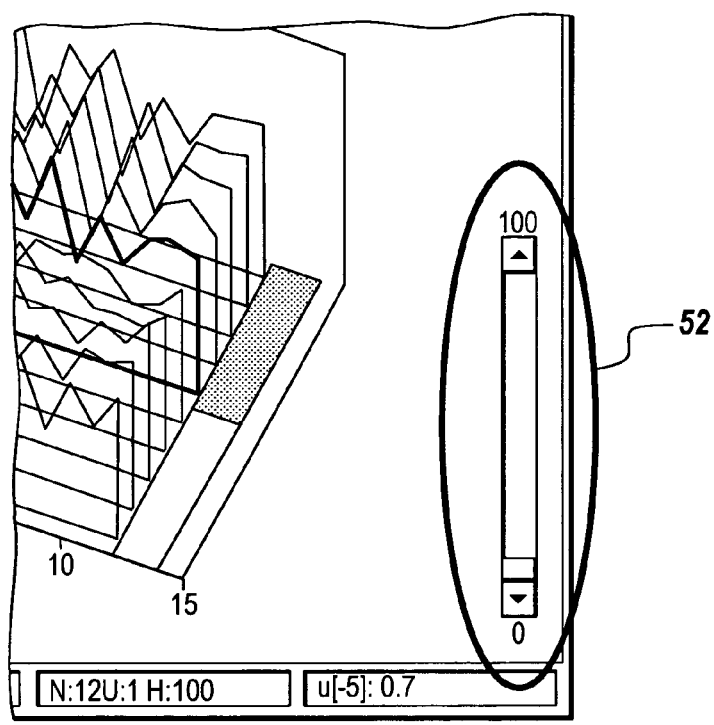
FIG. 6A is a screen depiction of a scroll bar, according to one aspect of the present invention.
Figure 6B:
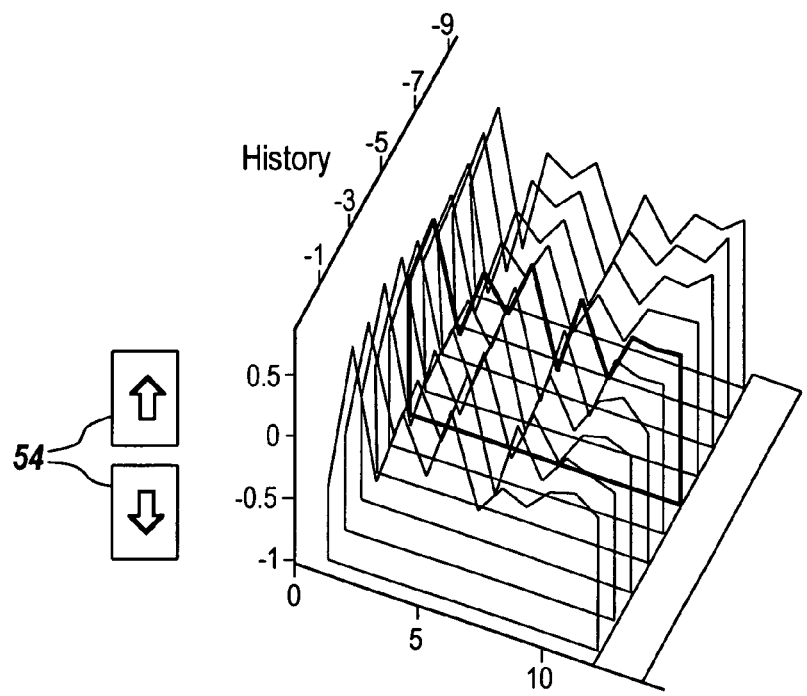
FIG. 6B is a screen depiction of a scroll button, according to one aspect of the present invention.

In accordance with another aspect of the present invention, a scroll function provides a user with the ability to scroll through previously recorded or collected data in the data history. The scroll functionality is configured to operate regardless of the status of system operation, such as while the system is running, paused, or halted. To scroll through the data, a user makes use of a user interface, such as the user interface illustrated in FIG. 6A. A scroll bar 52 is provided in a graphical display that enables a user to scroll up and down a display of recorded data. FIG. 6B shows an alternative user interface for scrolling in the form of two arrows 54 that can each be clicked to move a selected direction through the data. Other configurations for a user interface scroll function are also possible as understood by one of ordinary skill in the art.

Figure 7:
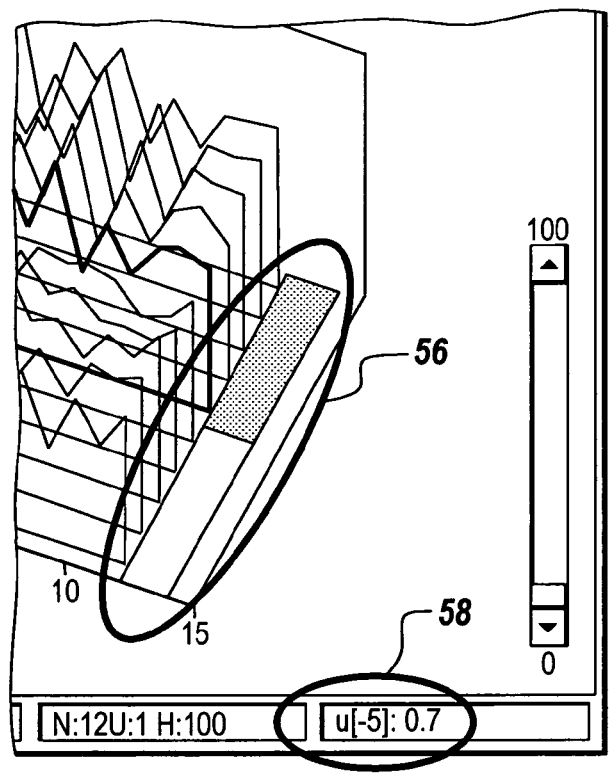
FIG. 7 is a screen depiction of a data history graphic, according to one aspect of the present invention.

Additional aspects of the present invention include an ability to graphically denote a gap in the recorded data history of a signal, using a time tracking function. For example, as shown in FIG. 7, executing a time tracking function a graphical band 56 of color corresponding spatially to the time history of the displayed data results. Changing the color of the band 56 at the same spatial position as the gap in recorded data indicates this gap visually to the user. The gap is determined by noting when data is being collected, and when data is not being collected, and indicating such instances relative to the time as measured by a time stamp clock. Hovering over the band 56, clicking on the band 56, or other interaction with the band 56 causes a data history time stamp 58 to be displayed in some manner, such as in the lower tool bar location shown. The time stamp 58 correlates to the location on the band 56 and the time associated with the time the data was collected. In addition, the data corresponding to the time stamp 58 is also highlighted in an appropriate display-specific manner.

The controller 50 can further include a synchronizing function that acts to synchronize the control of each of the data modules and their corresponding data collection and display parameters. The synchronizing function can be activated by clicking on a scope link button 57. For example, when activated, the synchronizing function can implement any of the above-mentioned functions at all of the data modules coupled with the dynamic system 20, or with certain selected data modules, as desired.

More specifically, and referring back to FIG. 3 and FIG. 4A, a user selects the synchronizing function by clicking on a scope link button 57. The user then selects the snapshot function by clicking on a snapshot button 53. The user can select the snapshot function to execute on the first data module 40 and the second data module 42, and then select the suspend function to execute on the third data module 44 and the fourth data module 46. One of ordinary skill in the art will appreciate that this particular configuration of snapshot and suspend functions is merely an example. Any of the functions can be executed at any or all of the data modules in the dynamic system 20, unless there is a conflict between the operation of the particular functions selected. The selection of functions, and their corresponding assignment to a particular data module, can be done either before the dynamic system 20 begins to operate (whether in real time or as a simulation) or dynamically while the dynamic system 20 is running.

Continuing with the example, the user can then activate the snapshot function on the first data module 40 and the second data module 42. When synchronized in this manner, the snapshot function will simultaneously cause a pause in acquisition and display in the first data module 40 and the second data module 42, achieving synchronization of data analysis at that point in time. Similarly, the user can activate the suspend function, and the third data module 44 and fourth data module 46 will simultaneously cease data collection and display until further notice.

The synchronizing function has been illustrated above to enable the configuration of selected functions for selected data modules. In addition, the synchronizing function can be implemented for all data modules coupled with the dynamic system 20 at one time. For example, taking the snapshot function, a user can specify that the snapshot function be executed on all data modules in the dynamic system 20. Then, when activated, the display of data collection halts simultaneously at all data modules (in FIG. 3, data modules 40, 42, 44, and 46). The synchronizing function thus provides the user with the ability to control each of the data modules 40, 42, 44, and 46 in the dynamic system 20 from a central location, and execute synchronized function calls relating to data collection and review.

The synchronizing function can further create relationships between each of the data modules 40, 42, 44, and 46. For example, a review of previously captured data can be performed on all data modules 40, 42, 44, and 46 individually. In addition, executing a function on one of the data modules can command a corresponding action on other of the data modules. For example, the controller 50 can be configured to execute the snapshot function in the first data module 40 to momentarily pause the display of data while data continues to be collected. This action is broadcast to the other data modules (the second data module 42, the third data module 44, and the fourth data module 46), and they too momentarily pause their displays of the data while data continues to be collected.

Additionally, the user can initiate the scroll function in the first data module 40 to review the data history made available by the snapshot function. Using the scroll function (scrolling back using a scroll bar, for example) on the first data module 40, results in not only a review of the data on the first data module 40, but also a simultaneous review is broadcast to other selected data modules, allowing the coordinated review of data recorded simultaneously at various points within the dynamic system. More specifically, the scroll function operating on the first data module 40 scrolls through data on the first data module 40. Simultaneously, the data on the second data module 42, the third data module 44, and the fourth data module 46 is also scrolled through. The display of data on each data module 40, 42, 44, and 46 corresponds to the same period in time, thus comparisons can be made between each of the data modules 40, 42, 44, and 46 at comparable time periods.

Some data modules can be configured to have their snapshot functions, suspend functions, and/or other functions be synchronized with all other such data modules, such that actions carried out on one data module (e.g., pausing and resuming) will affect all other such data modules simultaneously. Alternatively, some data modules can be configured to have their snapshot function, suspend function, and/or other functions, be unsynchronized, such that usage of a function on one data module will only pertain to that data module, or may only broadcast to selected other data modules but not all data modules coupled with the dynamic system 20.

In accordance with further aspects of the present invention, individual data modules can be configured to essentially ignore synchronization directives from the controller 50. This achieves necessary flexibility for controlling which data modules act in which manner to collect data.

It should also be noted that with regard to the data history function, previously described, multi-rate systems are also naturally accommodated by use of the synchronizing function to synchronize the execution system. The synchronization required across multiple data modules associated with signals possessing differing sample rates is particularly well suited to the use of this invention.

To further clarify certain aspects of the synchronization function, the synchronization function can operate in two primary configurations. There can be an event-based synchronization function that is triggered upon the occurrence of one or more events. For example, a user clicking a synchronization button, as described above, is one form of an event that triggers synchronization. Other events, such as time elapsed, receipt of certain data outputs, or other events can trigger the synchronization function. Alternatively, the synchronization can operate based on an active search mode. Such a configuration was also described above, wherein the occurrence of activation of a function, such as snapshot or suspend, at one data module broadcasts an instruction for other data modules to carry out the same function. In other words, the synchronization occurs on a subscription basis, where those data modules that subscribe to a selected controller will act in accordance with instructions broadcast to the subscribers.

Figure 8:
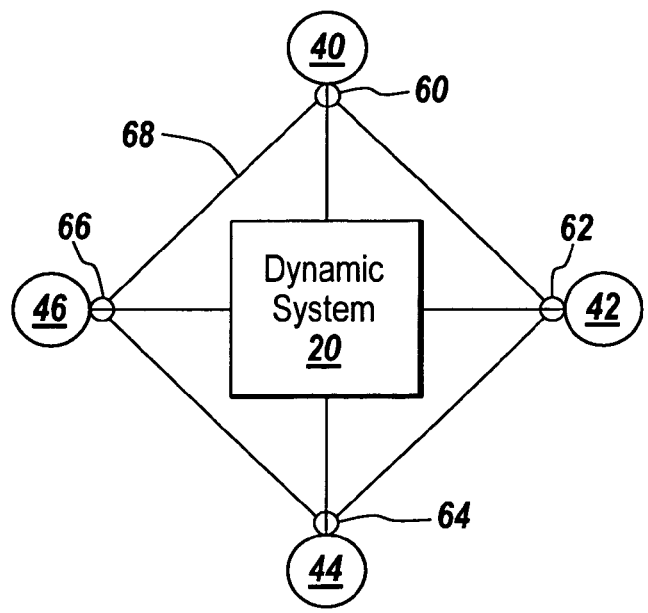
FIG. 8 is a diagrammatic illustration of a controller network, according to one aspect of the present invention.

FIG. 8 illustrates another embodiment of the present invention. To this point, the description has made use of the dynamic system 20 having the controller 50 that serves to configure and control the synchronization of any data module that is coupled to the dynamic system 20. In FIG. 8, the dynamic system 20 is shown with the first data module 40, the second data module 42, the third data module 44, and the fourth data module 46. However, the controller is not a separate component, but rather is a portion of each of the data modules 40, 42, 44, and 46. Thus, there is a first controller 60, a second controller 62, a third controller 64, and a fourth controller 66. Each controller 60, 62, 64, and 66 is communicatively coupled with one of the data modules 40, 42, 44, and 46. In addition, each of the controllers 60, 62, 64, and 66 is communicatively coupled with at least one other controller 60, 62, 64, and 66, such that the controllers 60, 62, 64, and 66 form a controller network 68. The controller network 68 links each of the controllers 60, 62, 64, and 66 in a manner that enables communication between data modules 40, 42, 44, and 46 to perform the synchronization operations as described above.

More specifically, each of the above functions, the snapshot function, the suspend function, the data history function, the data buffering function, the scroll function, the time tracking function, and the synchronizing function, can be included in the configuration of each of the data modules 40, 42, 44, and 46. In addition, other similar functions can be included in the configuration of each of the data modules 40, 42, 44, and 46, and/or some of the functions may or may not be included in the data module configurations.

If there is to be synchronization of the data modules 40, 42, 44, and 46 in accordance with the present invention, the synchronizing function is included in the configuration of each data module that is to be synchronized. The synchronizing function operates similarly to the previously described embodiment. When activated, the synchronizing function can implement any of the above-mentioned functions at all of the data modules coupled with the dynamic system 20, or with certain selected data modules, as desired.

More specifically, and referring to FIG. 8, as with the previous example, a user can select the snapshot function to execute on the first data module 40 and the second data module 42, and then select the suspend function to execute on the third data module 44 and the fourth data module 46. One of ordinary skill in the art will appreciate that this particular configuration of snapshot and suspend functions is merely an example. Any of the functions can be executed at any or all of the data modules in the dynamic system 20, unless there is a conflict between the operation of the particular functions selected. The selection of functions, and their corresponding assignment to a particular data module, can be done either before the dynamic system 20 begins to operate (whether in real time or as a simulation) or dynamically while the dynamic system 20 is running.

The user can then activate the snapshot function on the first data module 40 and the second data module 42. When synchronized in this manner, the snapshot function will simultaneously pause the displays in the first data module 40 and the second data module 42, achieving synchronization of data analysis at that point in time. Similarly, the user can activate the suspend function so that the third data module 44 and fourth data module 46 will simultaneously cease data collection and display updates until further notice.

As with the previous embodiment, the synchronizing function can be implemented for the data modules that include controllers 60, 62, 64, and 66 and are coupled with the dynamic system 20. Again looking at the snapshot function, the snapshot function can be configured to operate on all data modules 40, 42, 44, and 46 in the dynamic system 20. Then, when activated, the display of data collection halts simultaneously at all data modules 40, 42, 44, and 46. In operation, when one of the data modules, for example the first data module 40, activates the snapshot function, if any of the other data modules 42, 44, and 46 that are connected with the controller network 68 are configured to activate a snapshot function and are likewise configured to receive and act upon synchronizing function directives to synchronize, then such other data modules 42, 44, and 46 will likewise activate their snapshot functions. Thus, the synchronizing function again provides the user with the ability to control each of the data modules 40, 42, 44, and 46 in the dynamic system 20. Although in this embodiment the controller is in the form of a distributed configuration made up of the first controller 60, the second controller 62, the third controller 64, and the fourth controller 66, the result is the same, in that synchronized function calls relating to data collection and review can be executed.

In the distributed configuration, the controllers 60, 62, 64, and 66 that support the synchronizing function create relationships between each of the data modules 40, 42, 44, and 46. As in the previous embodiment, a review of previously captured data can be performed on all data modules 40, 42, 44, and 46 individually. In addition, executing a function on one of the data modules can command a corresponding action on any of the other data modules. When the snapshot function in the first data module 40 momentarily pauses the display of data while data continues to be collected, the action can be simultaneously broadcast to the other data modules (the second data module 42, the third data module 44, and the fourth data module 46). Upon receipt of the synchronize instructions, each of the remaining data modules (the second data module 42, the third data module 44, and the fourth data module 46) also momentarily pauses their displays of the data while data continues to be collected.

Also operational in the distributed controller embodiment is the ability for the user to initiate a review of the data utilizing a synchronized scroll function. Activating the scroll function in the first data module 40 enables the user to review the data history made available by the snapshot function. Using the scroll function (scrolling back using a scroll bar, for example) on the first data module 40, results in not only a review of the data on the first data module 40, but also a simultaneous review is broadcast to other selected data modules, allowing the coordinated review of data recorded simultaneously at various points within the dynamic system 20. More specifically, the scroll function operating on the first data module 40 scrolls through data on the first data module 40. Simultaneously, the data on the second data module 42, the third data module 44, and the fourth data module 46 is also scrolled through. The display of data on each data module 40, 42, 44, and 46 corresponds to the same period in time, thus comparisons can be made between each of the data modules 40, 42, 44, and 46 at comparable time periods.

Figure 9A:
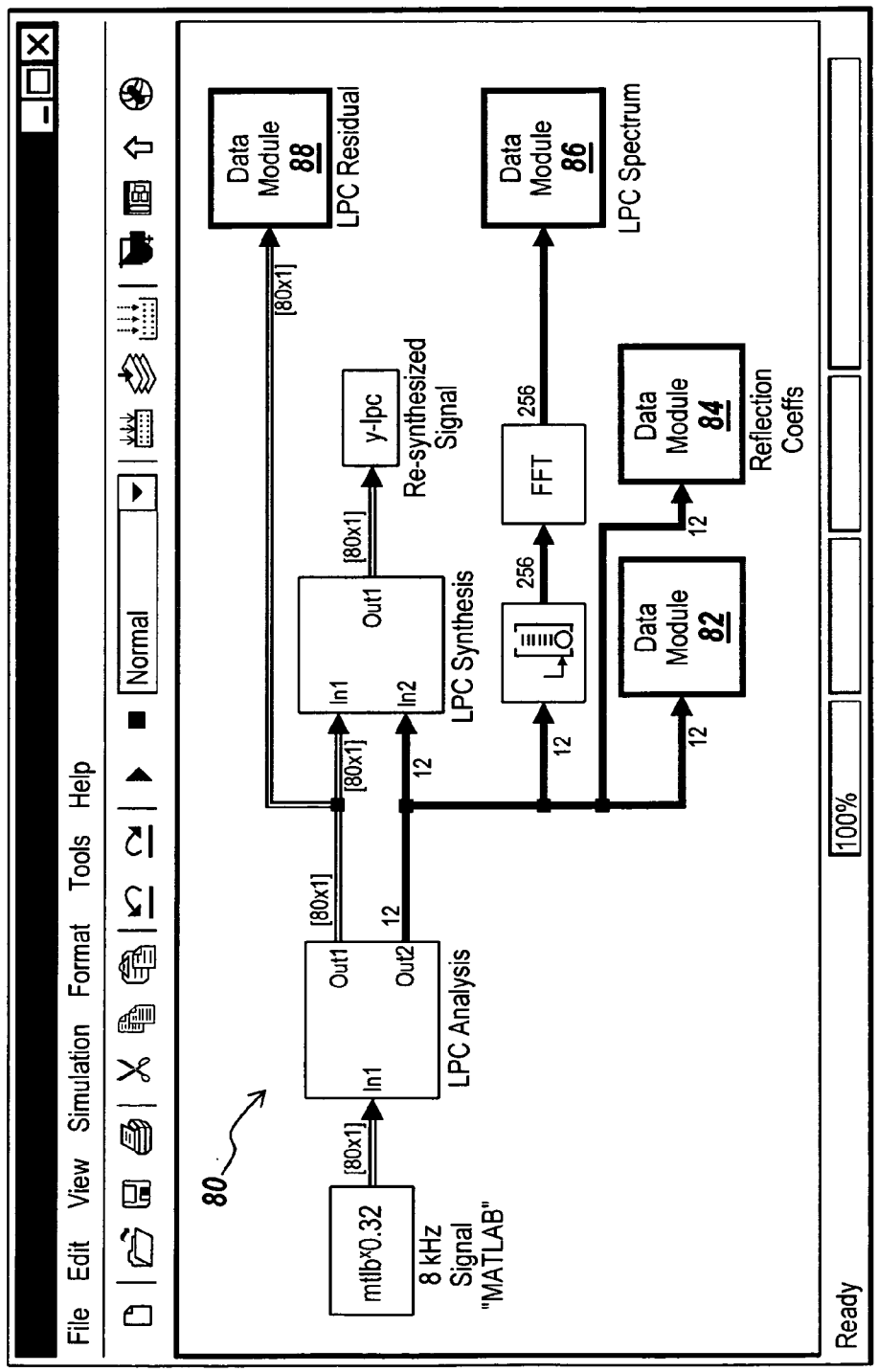
FIG. 9A is a screen depiction of a dynamic system model simulation with a plurality of data modules, according to one aspect of the present invention.

FIG. 9A illustrates the configuration of FIG. 8 as implemented in Simulink®. A dynamic system 80 is shown with a first data module 82, a second data module 84, a third data module 86, and a fourth data module 88. The controller is not a separate component, but rather is a portion of each of the data modules 82, 84, 86, and 88. Thus, the controllers are coupled one with each of the data modules 82, 84, 86, and 88 in a manner such that they are not depicted in the Simulink® simulation. As before, each of the controllers is communicatively coupled with at least one other controller, such that the controllers form a controller network, which is again not visible in the Simulink® simulation. The controller network links each of the controllers in a manner that enables communication between data modules 82, 84, 86, and 88 to perform the synchronization operations as described above.

More specifically, each of the above functions, the snapshot function, the suspend function, the data history function, the data buffering function, the scroll function, the time tracking function, and the synchronizing function, can be included in the configuration of each of the data modules 82, 84, 86, and 88. In addition, other similar functions can be included in the configuration of each of the data modules 82, 84, 86, and 88 and/or some of the functions may or may not be included in the data module configurations.

Figure 9B:
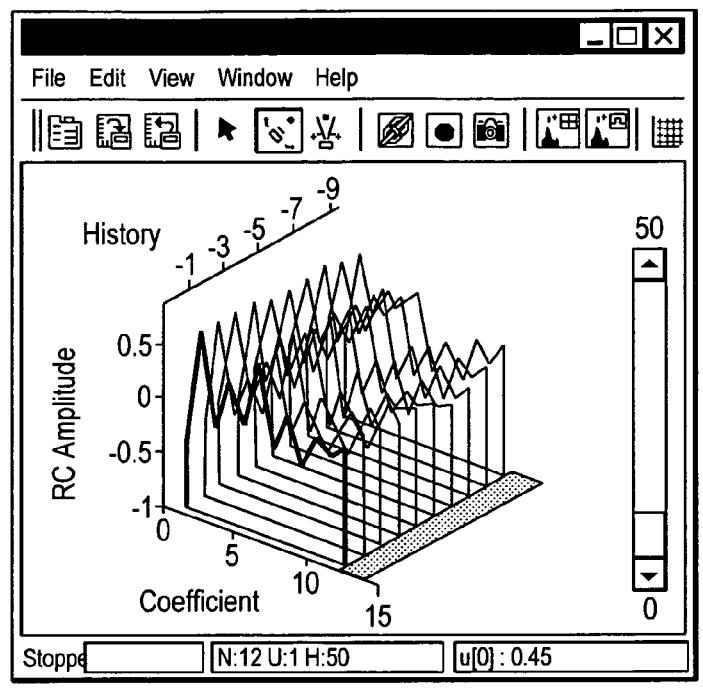
FIGS. 9B, 9C, 9D, and 9E are screen depictions of graphic displays of data generated by the data modules of FIG. 9A.
Figure 9C:
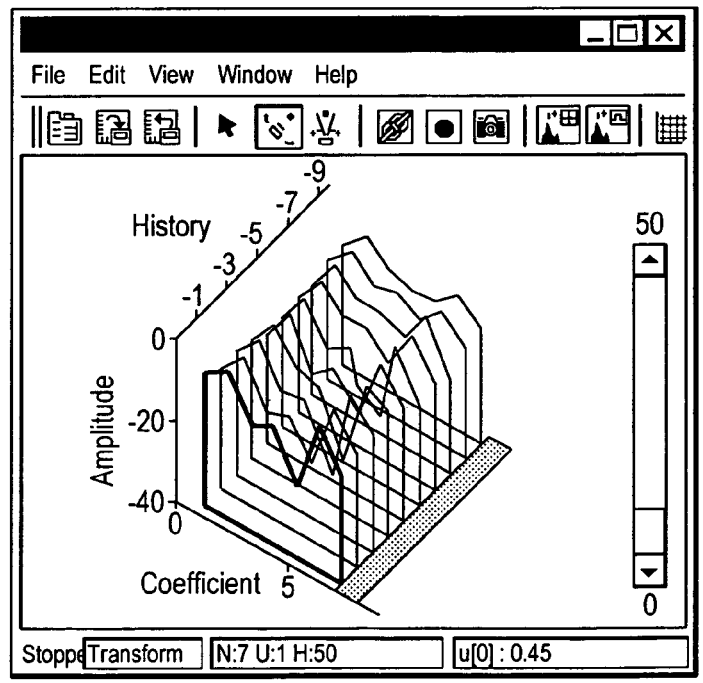
Figure 9D:
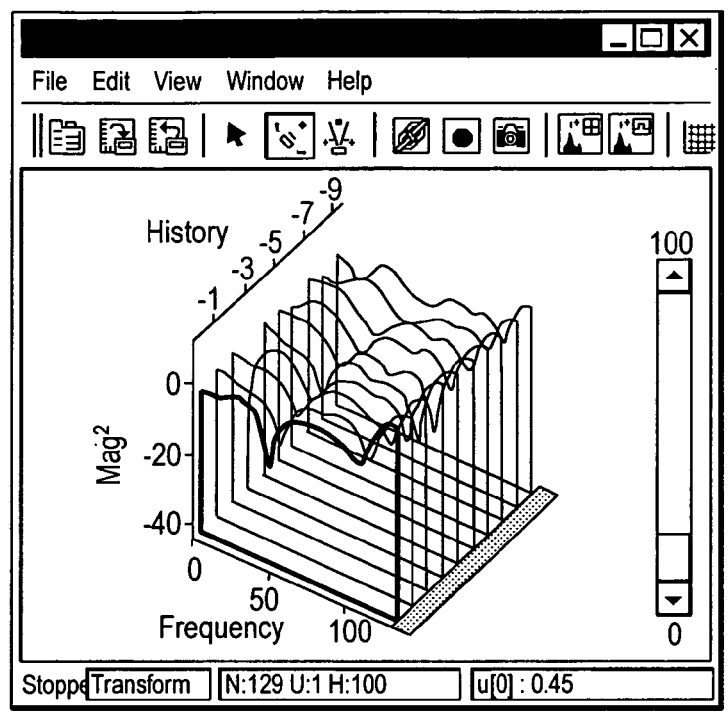
Figure 9E:
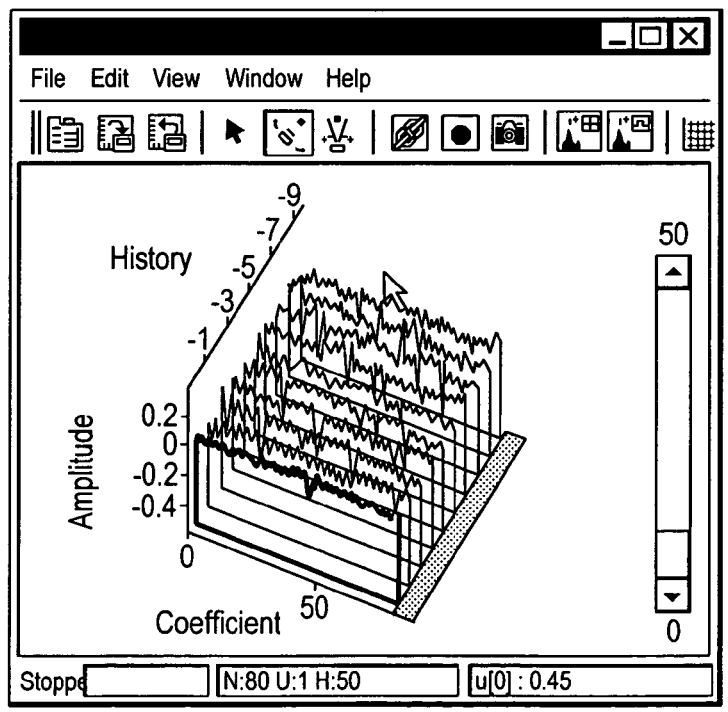

FIGS. 9B, 9C, 9D, and 9E illustrate example graphical outputs of each of the data modules 82, 84, 86, and 88. More specifically, each of the graphical outputs depict different recorded values of different measurement variables as collected by the data modules 82, 84, 86, and 88. FIG. 9B depicts the output of data module 82. FIG. 9C depicts the output of data module 84. FIG. 9D depicts the output of data module 86. FIG. 9E depicts the output of data module 88. One of ordinary skill in the art will appreciate that the graphical outputs illustrated are merely examples, and that the data modules 82, 84, 86, and 88 can implement a number of different collection and analysis methods for manipulating the data produced by the dynamic system. The present invention is thus not limited to the illustrative examples depicted in the figures.

Some data modules can be configured to have their snapshot functions, suspend functions, and/or other functions be synchronized with all other such data modules, such that actions carried out on one data module (e.g., pausing and resuming) will affect all other such data modules simultaneously. Alternatively, some data modules can be configured to have their snapshot function, suspend function, and/or other functions, be unsynchronized, such that usage of a function on one data module will only pertain to that data module, or may only broadcast to selected other data modules but not all data modules coupled with the dynamic system 20. In addition, some data modules 40, 42, 44, or 46 may also be configured to not partake in the controller network 68, and thus not receive synchronization instructions. The location of the instruction of whether or not to synchronize depends upon the particular configuration of the controller, as understood by one of ordinary skill in the art. For example, if there is a more centralized controller structure, such as that which is depicted in FIG. 3, then the controller 50 can have access to a memory means to store such instructions. If there is a more distributed controller structure, such as that which is depicted in FIG. 8, then the controllers 60, 62, 64, and 66 can each have access to the same memory means or to individual means of memory for storage of instruction. The memory means can include a data storage device, RAM, ROM, disk drive, and the like.

The present invention provides the user with the ability to better control, manipulate, review, and synchronize the collection of data in a dynamic system. The dynamic system includes two or more data modules that collect and either forward or display the data. A central controller or a distributed plurality of controllers are provided to configure the data collection and display parameters as well as synchronize data collection as desired. The result is a coordinated data collection process that more effectively collects and controls data generated by the dynamic system.

The present invention proposes several specific mechanisms which, when used together, achieve effective synchronization and data review for free-running instrumentation. In addition, interactive data capture and review is crucial to the effectiveness of numerical simulation and real time system measurement tools. The present invention further provides tools for using a graphical, block-diagram based simulation environment to design, simulate, and/or analyze dynamic systems employing mathematical models of system components.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure may vary substantially without departing from the spirit of the present invention, and exclusive use of all modifications that come within the data module of the appended claims is reserved. It is intended that the present invention be limited only to the extent required by the appended claims and the applicable rules of law.

What is claimed is:

1. In a simulation environment, a computer-implemented method for controlling collection of data generated by a dynamic system model, comprising:

providing the dynamic system model in the simulation environment on a computer system;

providing a controller system separate from the dynamic system model on the computer system, the controller system including:

at least two free-running data modules, the free-running data modules communicatively coupled to collect data from the dynamic system model, one or more functions, the one or more functions executed by at least two of the free-running data modules, and at least one controller controlling two or more of the free-running data modules;

activating the dynamic system model, thereby generating data; and controlling two or more of the free-running data modules to simultaneously execute at least one of the functions to achieve synchronization of at least one of collection or analysis of the generated data at a point in time, the controlling performed using the at least one controller.

2. The method of claim 1, where:

each of the two or more of the free-running data modules includes a display of the data collected by that free-running data module, the at least one of the functions includes a snapshot function, the snapshot function freezing the display of the data collected at the free-running data module that executes the snapshot function, and where:

the controlling simultaneously executes the snapshot function at the two or more of the free-running data modules to synchronously freeze the displays of the data collected by the controlled free-running data modules, the freezing occurring while the dynamic system model continues to execute and the generated data continues to be collected by the controlled free-running data modules.

3. The method of claim 2, further comprising providing the display of data collected while data continues to be collected without updating the display.

4. The method of claim 2, further comprising manipulating at least one of the frozen displays of data collected while data continues to be collected.

5. The method of claim 1, where:

the at least one of the functions includes a suspend function, and where:

the controlling simultaneously executes the suspend function at the two or more of the free-running data modules to synchronously pause collection of the generated data by the controlled free-running data modules while the dynamic system model continues to operate.

6. The method of claim 1, further comprising providing an interface having a communication port for communicating with each of the two or more of the free-running data modules.

7. The method of claim 1, further comprising directing a review of data collected by the two or more of the free-running data modules by utilizing a review function.

8. The method of claim 1, further comprising defining data history parameters utilizing a data history function.

9. The method of claim 8, wherein the data history parameters comprise at least one of amount of data history, amount of memory allocation for storing data history, types of data collected, signal attributes, and data formats.

10. The method of claim 1, further comprising directing a buffering mode to be utilized during data collection from one of a circular buffering mode, a finite buffering mode, and a buffer extension mode by executing a data buffering mode function.

11. The method of claim 1, further comprising utilizing a scroll function to scroll through previously collected data while the dynamic system model is operating.

12. The method of claim 1, further comprising providing a time tracking function that directs a graphical display indication of a time history of data collected.

13. The method of claim 1, wherein controlling the two or more of the free-running data modules comprises conveying to the two or more of the free-running data modules a direction to synchronize execution of the at least of the functions at the two or more of the free-running data modules by utilizing a broadcasting function.

14. The method of claim 1, further comprising utilizing an event based trigger to initiate a data module action.

15. The method of claim 1, wherein the simulation environment comprises at least one of a graphical, textual, data flow, time based, and event based environments.

16. The method of claim 1, wherein the two or more of the free-running data modules are virtually formed using at least one of C++ and object-oriented code.

17. The method of claim 1, wherein the two or more of the free-running data modules provide displays in the form of at least one of textual, graphical, multi-dimensional, oscilloscope, and spectrum analyzer.

18. In a simulation environment, a computer-implemented method for controlling collection of data generated by a dynamic system model, comprising:
providing the dynamic system model in the simulation environment on a computer system;
providing a controller system separate from the dynamic system model on the computer system, the controller system including:
at least two data modules, the data modules communicatively coupled to collect data from the dynamic system model, each of the at least two data modules operating in one of a free-running mode or a triggered mode, wherein a data module operating in triggered mode staffs data collection when a trigger event occurs and stops data collection when a stop event occurs, the trigger event being external to the data module, the stop event being internal to the data module,
a snapshot function executed by at least two of the data modules that include a display of the data collected by that data module, the snapshot function freezing the display of the data collected, and
at least one controller controlling two or more of the data modules;
activating the dynamic system model, thereby generating data; and
controlling a first set of two or more of the data modules to simultaneously execute the snapshot function to synchronously freeze the displays of the data collected by the controlled data modules, the freezing occurring while the dynamic system model continues to execute and the generated data continues to be collected by the controlled data modules, the controlling performed using the at least one controller between the starting and the stopping of the first set.

19. The method of claim 18, further comprising providing the display of data collected while data continues to be collected without updating the display.

20. The method of claim 18, further comprising manipulating at least one of the frozen displays of data collected while data continues to be collected.

21. The method of claim 18, further comprising:
controlling a second set of two or more of the data modules to simultaneously execute a suspend function to synchronously pause collection of the generated data by the second set while the dynamic system model continues to operate, the controlling performed using the at least one controller, the second set differing from the first set by at least one data module.

22. The method of claim 18, further comprising providing an interface having a communication port for communicating with each of the data modules in the first set.

23. The method of claim 18, further comprising directing a review of data collected by the first set by utilizing a review function.

24. The method of claim 18, further comprising defining data history parameters utilizing a data history function.

25. The method of claim 24, wherein the data history parameters comprise at least one of amount of data history, amount of memory allocation for storing data history, types of data collected, signal attributes, and data formats.

26. The method of claim 18, further comprising directing a buffering mode to be utilized during data collection from one of a circular buffering mode, a finite buffering mode, and a buffer extension mode by executing a data buffering mode function.

27. The method of claim 18, further comprising utilizing a scroll function to scroll through previously collected data while the dynamic system model is operating.

28. The method of claim 18, further comprising providing a time tracking function that directs a graphical display indication of a time history of data collected.

29. The method of claim 18, wherein controlling the first set comprises conveying to the first set a direction to synchronize execution of the snapshot function at first set by utilizing a broadcasting function.

30. The method of claim 18, further comprising utilizing an event based trigger to initiate a data module action.

31. The method of claim 18, wherein the simulation environment comprises at least one of a graphical, textual, data flow, time based, and event based environments.

32. The method of claim 18, wherein the first set is virtually formed using at least one of C++ and object-oriented code.

33. The method of claim 18, wherein the first set provides displays in the form of at least one of textual, graphical, multi-dimensional, oscilloscope, and spectrum analyzer.

34. In a simulation environment, a computer-implemented method for controlling collection of data generated by a dynamic system model, comprising:
  providing the dynamic system model in the simulation environment on a computer system;
  providing a controller system separate from the dynamic system model on the computer system, the controller system including:
    at least two free-running data modules, the free-running data modules communicatively coupled to collect data from the dynamic system model,
    a suspend function executed by at least two of the free-running data modules, and
    at least one controller controlling two or more of the free-running data modules;
  activating the dynamic system model, thereby generating data; and
  controlling a first set of two or more of the at least two free-running data modules to simultaneously execute the suspend function to synchronously pause collection of the generated data by the controlled free-running data modules while the dynamic system model continues to operate, the controlling performed using the at least one controller.

35. The method of claim 34, the controller system further including:
  a second set of two or more of the at least two free-running data modules, each data module in the second set including a display that displays data collected by that free-running data module, the second set differing from the first set by at least one free-running data module; and
  a snapshot function executed by the second set, the snapshot function freezing the display of the data collected at the free-running data module that executes the snapshot function; and
the method further comprising:
  controlling the second set to simultaneously execute a snapshot function to synchronously freeze the displays of the data collected by the second set, the freezing occurring while the dynamic system model continues to execute and the generated data continues to be collected by the second set, the controlling performed using the at least one controller.

36. The method of claim 35, further comprising providing the display of data collected while data continues to be collected without updating the display.

37. The method of claim 35, further comprising manipulating at least one of the frozen displays of data collected while data continues to be collected.

38. The method of claim 34, further comprising providing an interface having a communication port for communicating with each of the first set.

39. The method of claim 34, further comprising directing a review of data collected by the first set by utilizing a review function.

40. The method of claim 34, further comprising defining data history parameters utilizing a data history function.

41. The method of claim 40, wherein the data history parameters comprise at least one of amount of data history, amount of memory allocation for storing data history, types of data collected, signal attributes, and data formats.

42. The method of claim 34, further comprising directing a buffering mode to be utilized during data collection from one of a circular buffering mode, a finite buffering mode, and a buffer extension mode by executing a data buffering mode function.

43. The method of claim 34, further comprising utilizing a scroll function to scroll through previously collected data while the dynamic system model is operating.

44. The method of claim 34, further comprising providing a time tracking function that directs a graphical display indication of a time history of data collected.

45. The method of claim 34, wherein controlling the first set comprises conveying to the first set a direction to synchronize execution of the suspend function at the first set by utilizing a broadcasting function.

46. The method of claim 34, further comprising utilizing an event based trigger to initiate a data module action.

47. The method of claim 34, wherein the simulation environment comprises at least one of a graphical, textual, data flow, time based, and event based environments.

48. The method of claim 34, wherein the first set is virtually formed using at least one of C++ and object-oriented code.

49. The method of claim 34, wherein the first set provides displays in the form of at least one of textual, graphical, multi-dimensional, oscilloscope, and spectrum analyzer.

50. A computer-implemented method for controlling collection of data generated by a dynamic system, comprising:
  providing the dynamic system;
  providing a controller system separate from the dynamic system on a computer system, the controller system including:
    at least two data modules, the data modules communicatively coupled to collect data from the dynamic system, each of the at least two data modules operating in one of a free-running mode or a triggered mode, wherein a data module operating in triggered mode starts data collection when a trigger event occurs and stops data collection when a stop event occurs, the trigger event being external to the data module, the stop event being internal to the data module,
    one or more functions, the one or more functions executed by at least two of the data modules, and
    at least one controller controlling two or more of the data modules;
  activating the dynamic system, thereby generating data; and
  controlling two or more of the data modules to simultaneously execute at least one of the functions to achieve synchronization of at least one of collection or analysis of the generated data at a point in time, the controlling performed using the at least one controller between the starting and the stopping of the controlled data modules.

51. The method of claim 50, where:
  each of the two or more of the data modules includes a display of the data collected by that data module,
  the at least one of the functions includes a snap shot function, the snap shot function freezing the display of the data collected at the data module that executes the snapshot function, and where:
  the controlling simultaneously executes the snapshot function at the two or more data modules to synchronously freeze the displays of the data collected by the controlled data modules, the freezing occurring while the dynamic system continues to execute and the generated data continues to be collected by the controlled data modules.

52. The method of claim 51, further comprising providing the display of data collected while data continues to be collected without updating the display.

53. The method of claim 51, further comprising manipulating at least one of the frozen displays of data collected while data continues to be collected.

54. The method of claim 50, where:
the at least one of the functions includes a suspend function, and where:
the controlling simultaneously executes the suspend function at the two or more data modules to synchronously pause collection of the generated data by the controlled data modules while the dynamic system continues to operate.

55. The method of claim 50, further comprising providing an interface having a communication port for communicating with each of the two or more data modules.

56. The method of claim 50, further comprising directing a review of data collected by the two or more of the data modules by utilizing a review function.

57. The method of claim 50, further comprising defining data history parameters utilizing a data history function.

58. The method of claim 57, wherein the data history parameters comprise at least one of amount of data history, amount of memory allocation for storing data history, types of data collected, signal attributes, and data formats.

59. The method of claim 50, further comprising directing a buffering mode to be utilized during data collection from one of a circular buffering mode, a finite buffering mode, and a buffer extension mode by executing a data buffering mode function.

60. The method of claim 50, further comprising utilizing a scroll function to scroll through previously collected data while the dynamic system is operating.

61. The method of claim 50, further comprising providing a time tracking function that directs a graphical display indication of a time history of data collected.

62. The method of claim 50, wherein controlling the two or more of the data modules comprises conveying to the two or more of the data modules a direction to synchronize execution of the at least one of the functions at the two or more of the data modules by utilizing a broadcasting function.

63. The method of claim 50, further comprising utilizing an event based trigger to initiate a data module action.

64. The method of claim 50, wherein the simulation environment comprises at least one of a graphical, textual, data flow, time based, and event based environments.

65. The method of claim 50, wherein the two or more of the data modules are virtually formed using at least one of C++ and object-oriented code.

66. The method of claim 50, wherein the two or more of the data modules provide displays in the form of at least one of textual, graphical, multi-dimensional, oscilloscope, and spectrum analyzer.

67. The method of claim 50, wherein the dynamic system is at least one of a virtual system and a physical system.

68. In a simulation environment, a system for controlling collection of data generated by a dynamic system model, the system comprising:
an electronic device including:
a memory storing:
computer program instructions for a simulation application that includes the dynamic system model, and
data generated by the dynamic system model, and
a processor executing:
the stored computer program instructions, the computer program instructions including instructions for initializing the simulation application;
instructions for a controller system separate from the dynamic system model, the controller system including:
at least two free-running data modules, the free-running data modules communicatively coupled to collect data from the dynamic system model,
one or more functions, the one or more functions executed by at least two of the free-running data modules, and
at least one controller to control two or more of the free-running data modules to simultaneously execute at least one of the functions to achieve synchronization of at least one of collection or analysis of the generated data at a point in time.

69. In a simulation environment, a system for controlling collection of data generated by a dynamic system model, the system comprising:
an electronic device including:
a memory storing:
computer program instructions for a simulation application that includes the dynamic system model, and
data generated by the dynamic system model, and
a processor executing:
the stored computer program instructions, the computer program instructions including instructions for initializing the simulation application;
instructions for a controller system separate from the dynamic system model, the controller system including:
at least two free-running data modules, the free-running data modules communicatively coupled to collect data from the dynamic system model,
a snapshot function executed by at least two of the free-running data modules that include a display of the data collected by that free-running data module, the snapshot function freezing the display of the data collected, and
at least one controller to control two or more of the free-running data modules to simultaneously execute the snapshot function to synchronously freeze the displays of the data collected by the controlled data modules, the freezing occurring while the dynamic system model continues to execute and the generated data continues to be collected by the controlled data modules.

70. In a simulation environment, a system for controlling collection of data generated by a dynamic system model, the system comprising:
an electronic device including:
a memory storing:
computer program instructions for a simulation application that includes the dynamic system model, and
data generated by the dynamic system model, and
a processor executing:
the stored computer program instructions, the computer program instructions including instructions for initializing the simulation application;
instructions for a controller system separate from the dynamic system model, the controller system including:
at least two data modules, the data modules communicatively coupled to collect data from the dynamic system model, each of the at least two data modules operating in one of a free-running mode or a triggered mode, wherein a data module operating in triggered mode starts data collection when a trigger event occurs and stops data collection when a stop event occurs, the trigger event being external to the data module, the stop event being internal to the data module, a suspend function executed by at least two of the data modules, and at least one controller to control two or more of the data modules to simultaneously execute the suspend function to synchronously pause collection of the generated data by the controlled data modules while the dynamic system model continues to operate, the controlling performed between the starting and the stopping of the controlled data modules.

71. A computer-readable storage medium storing computer-executable instructions for controlling collection of data generated by a dynamic system model when executed by a processor, the medium storing instructions for:

providing a controller system separate from the dynamic system model, the controller system including:

at least two free-running data modules, the free-running data modules communicatively coupled to collect data from the dynamic system model, one or more functions, the one or more functions executed by at least two of the free-running data modules, and at least one controller controlling two or more of the free-running data modules;

activating the dynamic system model, thereby generating data; and controlling two or more of the free-running data modules to simultaneously execute at least one of the functions to achieve synchronization of at least one of collection or analysis of the generated data at a point in time, the controlling performed using the at least one controller.

72. The medium of claim 71, where:

each of the two or more of the free-running data modules includes a display of the data collected by that free-running data module, the at least one of the functions includes a snapshot function, the snapshot function freezing the display of the data collected at the free-running data module that executes the snapshot function, and where:

the controlling simultaneously executes the snapshot function at the two or more of the free-running data modules to synchronously freeze the displays of the data collected by the controlled data modules, the freezing occurring while the dynamic system model continues to execute and the generated data continues to be collected by the controlled data modules.

73. The medium of claim 72 further storing instructions for:

providing the display of data collected while data continues to be collected without updating the display.

74. The medium of claim 72 further storing instructions for:

manipulating at least one of the frozen displays of data collected while data continues to be collected.

75. The medium of claim 71, where:

the at least one of the functions includes a suspend function, and where:

the controlling simultaneously executes the suspend function at the two or more free-running data modules to synchronously pause collection of the generated data by the controlled data modules while the dynamic system continues to operate.

76. The medium of claim 71 further storing instructions for:

providing an interface having a communication port for communicating with each of the two or more of the free-running data modules.

77. The medium of claim 71 further storing instructions for:

directing a review of data collected by the two or more of the free-running data modules by utilizing a review function.

78. The medium of claim 71 further storing instructions for:

defining data history parameters utilizing a data history function.

79. The medium of claim 78, wherein the data history parameters comprise at least one of amount of data history, amount of memory allocation for storing data history, types of data collected, signal attributes, and data formats.

80. The medium of claim 71 further storing instructions for:

directing a buffering mode to be utilized during data collection from one of a circular buffering mode, a finite buffering mode, and a buffer extension mode by executing a data buffering mode function.

81. The medium of claim 71 further storing instructions for:

utilizing a scroll function to scroll through previously collected data while the dynamic system model is operating.

82. The medium of claim 71 further storing instructions for:

providing a time tracking function that directs a graphical display indication of a time history of data collected.

83. The medium of claim 71, wherein controlling the two or more of the free-running data modules comprises conveying to the two or more of the free-running data modules a direction to simultaneously execute the at least one of the functions by utilizing a broadcasting function.

84. The medium of claim 71 further storing instructions for:

utilizing an event based trigger to initiate a data module action.

85. The medium of claim 71, wherein the simulation environment comprises at least one of a graphical, textual, data flow, time based, and event based environments.

86. The medium of claim 71, wherein the two or more of the free-running data modules are virtually formed using at least one of C++ and object-oriented code.

87. The medium of claim 71, wherein the two or more of the free-running data modules provide displays in the form of at least one of textual, graphical, multi-dimensional, oscilloscope, and spectrum analyzer.

* * * * *

UNITED STATES PATENT AND TRADEMARK OFFICE
CERTIFICATE OF CORRECTION

PATENT NO. : 7,584,082 B2  Page 1 of 1
APPLICATION NO. : 10/637206
DATED : September 1, 2009
INVENTOR(S) : Donald Paul Orofino, II It is certified that error appears in the above-identified patent and that said Letters Patent is hereby corrected as shown below:

Column 3, Line 60 of the printed patent, "A method" should be --a method--.

Column 7, Line 9 of the printed patent, "provide" should be --provided,--.

Column 11, Line 42 of the printed patent, before the word "various" insert --provides--.

Column 19, Line 61 (Claim 18, Line 14) of the printed patent, "staffs" should be --starts--.

Column 20, Line 55 (Claim 29, Line 3) of the printed patent, after "at" insert --the--.

Column 22, Line 51 (Claim 51, Line 3) "snap shot" should be --snapshot--.

Column 22, Line 52 (Claim 51, Line 4) "snap shot" should be --snapshot--.

Signed and Sealed this

First Day of December, 2009

David J. Kappos
*Director of the United States Patent and Trademark Office*